United States Patent [19]

Fang et al.

[11] 4,371,843

[45] Feb. 1, 1983

[54] SEMICONDUCTOR DIFFERENTIAL AMPLIFIER CIRCUIT WITH FEEDBACK BIAS CONTROL

[75] Inventors: San-Chin Fang, New York, N.Y.; Donald L. Fraser, Jr., Warren Township, Somerset County, N.J.

[73] Assignee: Bell Telephone Laboratories, Incorporated, Murray Hill, N.J.

[21] Appl. No.: 166,486

[22] Filed: Jul. 7, 1980

[51] Int. Cl.³ .......................... H03F 3/45; H03F 3/16
[52] U.S. Cl. .................................. 330/253; 330/255; 330/257; 330/258; 330/259; 330/260
[58] Field of Search ............ 330/253, 255, 257, 258, 330/259, 260

[56] References Cited

U.S. PATENT DOCUMENTS 4,213,098  7/1980  Tsiviois .......................... 330/253
4,284,959  8/1981  Heagerty et al. ................ 330/253

OTHER PUBLICATIONS

DeMan, "A Low Input Capacitance Voltage Follower in a Compatible Silicon—Gate Mos—Bipolar Technology", *IEEE Journal of Solid—State Circuits*, vol. SC—12, No. 3, Jun., 1977, pp. 217-224.

Senderowicz et al., "High—Performance NMos Operational Amplifier", *IEEE Journal of Solid—State Circuits*, vol. SC—13, No. 6, Dec., 1978, pp. 760-766.

*Primary Examiner*—James B. Mullins
*Attorney, Agent, or Firm*—David I. Caplan

[57] ABSTRACT

An input differential amplifier stage (10), which feeds an output stage (20), has a feedback loop originating at a node ($N_1$) in one branch, for controlling the current-source transistor ($M_5$) of that stage. The feedback loop is characterized by a direct connection to the gate electrode of a transistor ($M_8$) which drives the output stage (20), while the output at another node ($N_2$), in the other branch of the differential amplifier stage (10) is fed to another transistor ($M_9$) which also drives the output stage (20).

13 Claims, 2 Drawing Figures

SEMICONDUCTOR DIFFERENTIAL AMPLIFIER CIRCUIT WITH FEEDBACK BIAS CONTROL

FIELD OF THE INVENTION

This invention relates to the field of semiconductor apparatus, and more particularly to MOS (metal-oxide-semiconductor) differential amplifier circuits.

BACKGROUND OF THE INVENTION

It is known in the MOS art that semiconductor wafer-to-wafer processing variations result in corresponding variations in the threshold voltages of MOS transistors, particularly depletion mode load transistors. These variations result in undesirable threshold voltage shifts from the proper value suitable for preserving the desired high incremental resistance and these load transistors in the circuit.

In a typical input stage of an MOS amplifier circuit, a depletion load transistor is connected in series with an input driver transistor device and a current-source. Unless the threshold voltage of the load transistor is controlled with a precision sufficient to provide during operation the correct amount of voltage drop for a given current-source, the biasing of the input driver device in series with this load transistor will not be suitable for achieving the desired high gain and linearity of the amplifier circuit. However, the correspondingly required precision of processing control is difficult, if at all possible, to achieve even in present day advanced processing technology. Moreover, variations in voltage supplies can also similarly deteriorate the gain of the amplifier.

In an application filed by Y. Tsividis (Ser. No. 010737) on Feb. 9, 1979, now U.S. Pat. No. 4,213,098 an amplifier circuit in MOS technology was described including a self-biased, stabilized differential amplifier stage that eliminated the need for precise matching of the threshold voltages of the depletion load transistors with the threshold voltages of the current-source transistors; that is, the circuit operation was relatively insensitive to processing variations. On the other hand, that circuit required a relatively large number of extra transistors; thereby the circuit achieved the purposes of that invention, but at the expense of a requirement of more silicon area.

SUMMARY OF THE INVENTION

Broadly speaking, this invention involves a differential amplifier circuit stage, typically an input stage, in which both a current-source transistor ($M_5$) and a first intermediate amplifier transistor ($M_8$) of a differential amplifier input stage (10) are controlled by the same feedback from a first node ($N_1$) located in one branch ($M_1$ in series with $M_3$) of the differential amplifier stage. The feedback path advantageously includes a pair of auxiliary transistors ($M_6$, $M_7$) which also provide D.C. bias for both the current-source transistor ($M_5$) and the first intermediate amplifier transistor ($M_8$). In addition, a capacitor ($C_A$) is connected to the first node ($N_1$) to bypass from the feedback path to ground (advantageously a source voltage supply terminal $V_{SS}$) any high frequency signals without disturbing the D.C. common mode bias as stabilized by the feedback path; and at the same time this bypass capacitor ($C_A$) improves the settling time of the amplifier in response to transient disturbances for relatively large (30 to 50 pf) capacitive loads, while it also improves the phase margin and gain margin for all loads. By "high frequency signals" here is meant signals of frequency in the neighborhood of $f_\pi$, i.e., where the phase of the output relative to the input is equal to 180°. By "phase margin" is meant ($180° - \phi_1$), where $\phi_1$ is the phase at unity gain of the output relative to the input. By "gain margin" is meant the gain at that frequency $f_\pi$.

Accordingly, this invention involves a semiconductor amplifier circuit in MOS technology containing a differential amplifier input stage (10) including a pair of substantially identical first and second mutually parallel branches ($M_1M_3$ and $M_2M_4$), having respectively first and second output nodes ($N_1$, $N_2$), said branches being connected through a common third node ($N_3$) to a controlled terminal of a common current-source transistor ($M_5$) for supplying current to both said branches, CHARACTERIZED IN THAT the first output node ($N_1$) of the first branch is connected to the gate electrode of a first auxiliary transistor ($M_6$) having one of its controlled terminals connected to a feedback node ($N_F$) which is connected both to the gate electrode of a first intermediate amplifier transistor ($M_8$) and to the gate electrode of said current-source transistor ($M_5$). In a specific embodiment, the circuit of the invention is CHARACTERIZED FURTHER BY a second auxiliary transistor ($M_7$) one of whose controlled terminals and whose gate electrode are connected to the feedback node ($N_F$), and the circuit is advantageously also CHARACTERIZED FURTHER IN THAT the gate electrode of said first auxiliary transistor ($M_6$) is connected through a bypass capacitor ($C_A$) to a reference voltage source (ground). By "controlled terminal" is meant a relatively high current carrying terminal, as the drain or source of an MOS transistor. With the circuit arrangement of this invention, fewer transistors are required in the input stage, and lower noise is obtainable, than in the circuit of the aforementioned patent application of Y. Tsividis, but at some sacrifice of insensitivity of circuit performance to processing variations.

BRIEF DESCRIPTION OF THE DRAWING

This invention together with its advantages, objects, and features may be better understood from the following detailed description when read in conjunction with the drawing in which.

The dashed lines across the channel of a given transistor indicates a depletion mode MOS transistor.

DETAILED DESCRIPTION

Figure 1:
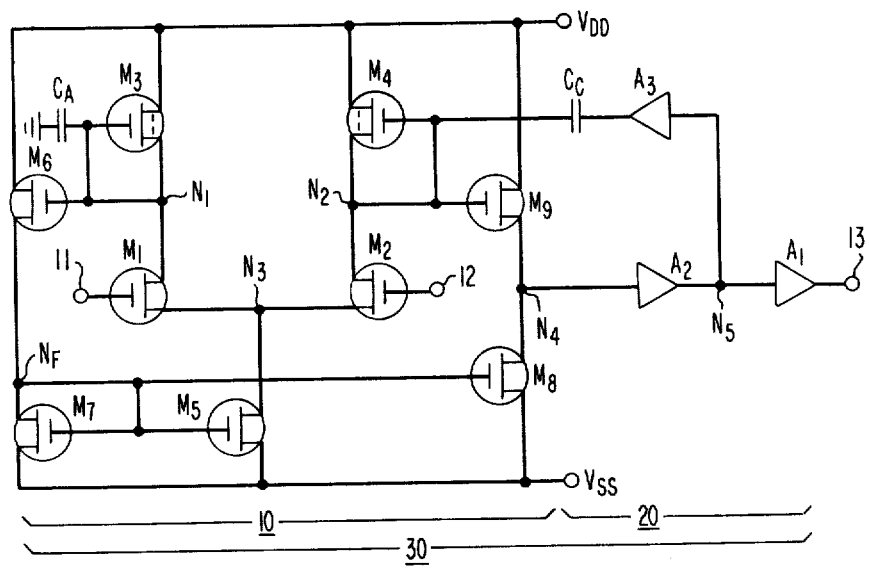
FIG. 1 is a schematic circuit diagram of an amplifier in MOS technology containing a differential amplifier input stage in accordance with a specific embodiment of the invention.

As shown in FIG. 1, an amplifier circuit 30 contains an MOS differential amplifier input circuit stage 10 and an amplifier circuit output stage 20. The input stage 10 includes a pair of signal input terminals 11 and 12, and an output node $N_4$ which feeds the output stage 20. This output stage 20 has an output terminal 13 for delivering to a utilization means (not shown) the output of the entire amplifier circuit 30 formed by the amplifier stages 10 and 20.

The input terminals 11 and 12 are connected to the gate electrodes of MOS transistors $M_1$ and $M_2$, respectively. The sources of $M_1$ and $M_2$ are connected together at a common node $N_3$ which is itself connected to the drain of a current-source MOS transistor $M_5$. The source of $M_5$ is connected to a source voltage supply terminal $V_{SS}$, typically of about $-5$ volts (N-MOS technology). The drains of $M_1$ and $M_2$ are connected to the nodes $N_1$ and $N_2$, respectively. These nodes $N_1$ and $N_2$ are separately connected through MOS load transistors $M_3$ and $M_4$, respectively, to a drain voltage supply terminal $V_{DD}$, typically supplying a voltage of about $+5$ volts (N-MOS technology). By "load transistor" is meant a transistor whose gate electrode is connected to a source or drain of the same transistor. In addition, the node $N_1$ is connected through an input stage feedback path (or "feedback loop") both to the gate electrode of the current-source transistor $M_5$ and to the gate electrode of a first MOS intermediate amplifier transistor $M_8$. This input stage feedback path runs from the first node $N_1$ to a feedback node $N_F$, and this path includes a first auxiliary MOS transistors $M_6$ whose source-drain path is connected in series with that of a second auxiliary MOS transistor $M_7$. More specifically, the node $N_1$ is connected to the gate electrode of the first auxiliary transistor $M_6$, while the source-drain paths of the auxiliary transistors $M_6$ and $M_7$ are connected together in series between the drain and source terminals $V_{DD}$ and $V_{SS}$. A feedback node $N_F$ between the source of $M_6$ and the drain of $M_7$ is connected to the gate electrodes of $M_5$, $M_7$, and $M_8$.

The node $N_2$ is connected to the gate electrode of a second MOS intermediate amplifier transistor $M_9$ whose source-drain path is connected in series with that of the first intermediate amplifier transistor $M_8$. The transistors $M_8$ and $M_9$ serve as an intermediate buffer amplifier.

In order to curtail excess high frequency signals through the feedback loop, the node $N_1$ is advantageously connected through a bypass capacitor $C_A$ to a reference voltage terminal or ground, advantageously the source voltage supply terminal $V_{SS}$.

A node $N_4$ between the source-drain paths of the intermediate amplifier transistors $M_8$ and $M_9$ serves as the output node of the intermediate buffer amplifier formed by $M_8$ and $M_9$, and this node $N_4$ can be connected to a variety of output amplifiers. For example, the node $N_4$ is connected to the input terminal of an MOS inverting amplifier $-A_2$. This amplifier $-A_2$ typically comprises a cascode amplifier. An output node $N_5$ of this amplifier $-A_2$ is connected to an input terminal of each of the MOS buffer amplifiers $A_1$ and $A_2$. The amplifier $A_1$ functions as a buffer amplifier connected so as to deliver its output to the output terminal 13 of the amplifier circuit 30, and the amplifier $A_3$ functions as an output feedback buffer amplifier connected so as to deliver its output through a "compensation" capacitor $C_c$ to the gate electrode of the load transistor $M_9$. The main purpose of this capacitor $C_c$ is to create a dominant or single-pole in the response of the open loop gain, in order to provide low (unity) gain at frequencies corresponding to phase shifts of approximately $2\pi/3$ ($=120°$) and thereby to suppress oscillations when the amplifier circuit 30 is connected in unity gain feedback configurations.

The feedback capacitor $C_B$ reduces the required value, and hence size, of the compensation capacitor $C_c$ to a reasonable value consistent with integrated MOS technology; that is, both $C_B$ and $C_c$ are advantageously of sufficiently small required size so as to be conveniently fabricated as integrated circuit type of capacitors that are commonly made in MOS technology, such as metal-polysilicon or polysilicon-polysilicon capacitors, or MOS capacitors.

It should be noted that the load transistors $M_3$ and $M_4$ operate in the saturation region, so that the current in each of these transistors is relatively constant in response to relatively moderate changes in gate voltages; whereas, the source-to-drain voltage drops across these transistors can change rather widely in response to such moderate changes in gate voltages. Thus, these load transistors are characterized by very high impedance, typically of the order of $10^5$ ohms or more; and each of these load transistors may be replaced by an electrically linear resistive material, such as a polycrystalline silicon strip of resistance of the order of $10^5$ to $10^6$ ohms.

During operation at relatively high frequencies (typically above about 1 MHz) the portion of the input feedback path in the input stage 10 which controls the gate electrode of the transistor $M_8$ tends to produce detrimental effects on gain and phase margin of the circuit 30 in the absence of the bypass capacitor $C_A$. More specifically, in the absence of this bypass capacitor $C_A$ the gain of the amplifier circuit 30 is, for reasonable values of $C_c$, typically greater than unity at frequencies for which the phase of the output relative to the input is 180°; thereby, in the absence of $C_A$ an instability is introduced by the feedback from terminal 13 to terminal 11 in unity gain, or nearly unity gain, configurations. The introduction of this bypass capacitor $C_A$ reduces the gain at high frequencies for which the phase shift of the output relative to the $C_A$ improves stability. Moreover, if $C_A$ is sufficiently large, for example of the order of $C_c$, the amplifier 30 is characterized by a desirable single-pole response; that is, the combined effect of the feedback from $C_c$ to the gate electrode of $M_9$ and the feedforward to the gate electrode of $M_8$ produces a 10dB drop of power gain per frequency decade in the neighborhood of the unity gain frequency, which corresponds to the desired single-pole response at which the settling time for transients is minimized for both positive and negative going signals applied to terminal 12 over a relatively wide range of loading at terminal 13. However, too large a value of $C_A$ will cause excessively slow settling time and/or a settling time which is undesirably dependent upon the polarity of the input signal applied to terminal 12. Thus, the capacitor $C_A$ substantially eliminates excess high frequency signals in the feedback loop from $N_1$ to $N_4$ and hence suppresses undesirable oscillation.

Figure 2:
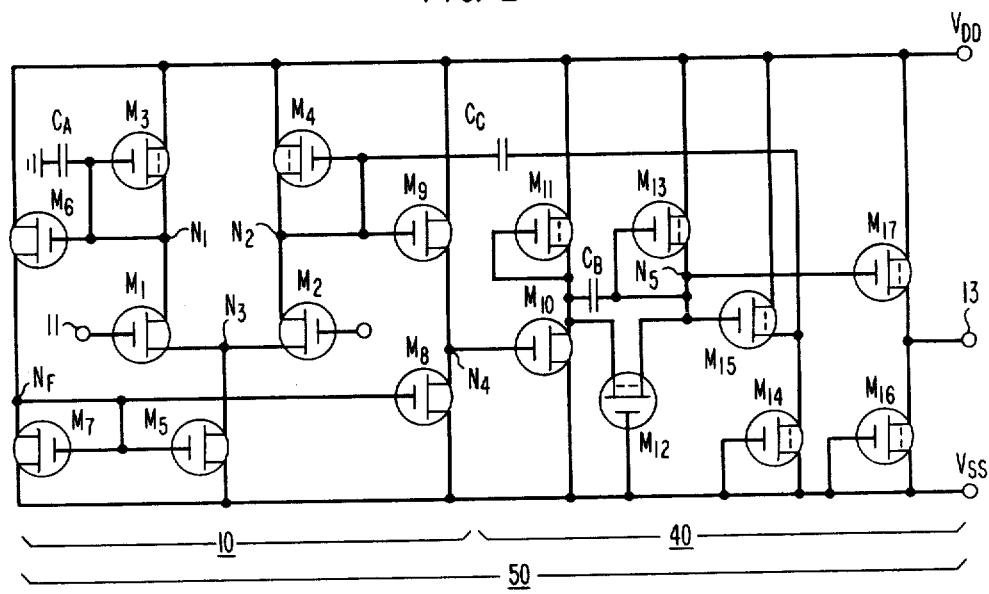
FIG. 2 is a schematic circuit diagram of the circuit shown in FIG. 1 showing in greater detail the output stage of the circuit of FIG. 1.

FIG. 2 shows a differential amplifier circuit 50, showing in greater detail a specific circuit realization 40 of the output stage 20 (FIG. 1) of the amplifier. Elements in the circuits shown in FIGS. 1 and 2 which are identical are denoted with the same reference numerals. The output circuit stage 40 includes an MOS driver transistor $M_{10}$ which controls the cascode amplifier arrangement formed by depletion mode MOS transistors $M_{11}$, $M_{12}$, and $M_{13}$. These transistors $M_{11}$, $M_{12}$, and $M_{13}$, together with the transistor driver $M_{10}$, form a specific realization of the inverting amplifier $-A_2$ of FIG. 1 with output node $N_5$. A pair of depletion mode series connected MOS transistors $M_{14}$ and $M_{15}$ form a buffer amplifier in a source-follower configuration (equivalent to the amplifier $A_3$ of FIG. 1) which is connected to deliver its output through the compensation capacitor $C_c$ to the node $N_2$. Another pair of depletion mode series connected MOS transistors $M_{16}$ and $M_{17}$ form another buffer amplifier in a source-follower configuration (equivalent to the amplifier A₁ of FIG. 1) having an output terminal 13 serving as the output terminal for the entire amplifier circuit 50.

Suitable values for the parameters of the various components shown in the circuit 40 may be illustratively selected (approximately) as follows. The capacitance of $C_A$ is 1.2 picofarad; the capacitance of $C_B$ is 0.8 picofarad; and the capacitance of $C_c$ is 1.6 picofarad. The substrate, that is, the semiconductor body material in which the various capacitor and transistor devices typically are integrated, in N-MOS technology is substantially uniform P-type monocrystalline silicon of bulk resistivity typically in the range of 6 to 10 ohm-cm. The depletion mode transistors are formed typically by arsenic ion implantation so that the threshold voltage of these depletion mode transistors ($M_3$, $M_4$, $M_{11}$, $M_{12}$, $M_{13}$, $M_{14}$, $M_{15}$, $M_{16}$, $M_{17}$) is typically about $-2.8$ volts, while the threshold of the remaining, enhancement mode transistors ($M_1$, $M_2$, $M_5$, $M_6$, $M_7$, $M_8$, $M_9$, $M_{10}$) is typically about $+0.25$ volts, all thresholds as measured under zero source-to-substrate bias voltage. Because of processing variations, however, the threshold voltage may vary from semiconductor wafer-to-wafer substrate but is substantially the same on a given wafer. The values of channel width/length (W/L), as well as operating drain-source currents ($I_D$) and transconductances $g_m$, are illustratively selected to be approximately as follows:

| | W(μm)/L(μm) | $I_D$(μA) | $g_m$(μmho) |
|---|---|---|---|
| $M_1$ | 160/20 | 16 | 96.4 |
| $M_2$ | 160/20 | 16 | 96.4 |
| $M_3$ | 21/50 | 16 | 20.4 |
| $M_4$ | 21/50 | 16 | 20.4 |
| $M_5$ | 20/20 | 32 | 45.0 |
| $M_6$ | 8/80 | 37 | 14.4 |
| $M_7$ | 24/20 | 37 | 53.0 |
| $M_8$ | 24/20 | 37 | 53.0 |
| $M_9$ | 8/80 | 37 | 14.4 |
| $M_{10}$ | 24/8 | 112 | 152 |
| $M_{11}$ | 25.5/20 | 109 | 89.5 |
| $M_{12}$ | 16/8 | 3 | 89.5 |
| $M_{13}$ | 8/160 | 3 | 2.8 |
| $M_{14}$ | 8/14 | 69.5 | 45.1 |
| $M_{15}$ | 40/8 | 69.5 | 155.0 |
| $M_{16}$ | 8/14 | 69.5 | 45.1 |
| $M_{17}$ | 8/8 | 69.5 | 64.3 |

Although the invention has been described in detail in conjunction with a specific embodiment, various modifications can be made without departing from the scope of the invention. For example, P-MOS technology can be used instead of N-MOS; other and different voltage supplies can be used; and depletion mode transistors can replace enhancement mode transistors. Also, particularly if $M_4$ is an enhancement mode rather than depletion mode transistor, the capacitor $C_c$ may be advantageously connected to the node $N_4$ instead of to the gate electrode of $M_9$. Moreover, other types of intermediate and output amplifier stages can also be used than described above.

We claim:

1. Semiconductor apparatus in MOS technology comprising a differential amplifier input stage (10) including a pair of substantially identical first and second mutually parallel branches ($M_1M_3$ and $M_2M_4$) having, respectively, first and second output nodes ($N_1$, $N_2$), said branches being connected through a common third node ($N_3$) to a controlled terminal of a common current-source transistor ($M_5$) for supplying current to both said branches, CHARACTERIZED IN THAT the first output node ($N_1$) of the first branch is directly connected to the gate electrode of a first auxiliary transistor ($M_6$) having one of its controlled terminals connected to a feedback node ($N_F$) which is connected both to the gate electrode of a first intermediate amplifier transistor ($M_8$) and to the gate electrode of said current-source transistor ($M_5$).

2. Apparatus according to claim 1 CHARACTERIZED FURTHER BY a second auxiliary transistor ($M_7$) one of whose controlled terminals and whose gate electrode are connected to the feedback node ($N_F$).

3. Apparatus according to claim 1 or 2, CHARACTERIZED FURTHER IN THAT the gate electrode of said first auxiliary transistor ($M_6$) is connected through a bypass capacitor ($C_A$) to a reference voltage terminal (ground).

4. Semiconductor apparatus according to claim 3 in which the first branch and the second branch, respectively, includes a first and a second input signal transistor ($M_1$, $M_2$) one of the gate terminals of each of which is connected, respectively, to a separate input signal terminal (11, 12).

5. Semiconductor apparatus according to claim 4 in which each said branch further includes a separate electrical load device ($M_3$, $M_4$) each of which is connected in series with the source-drain path of the corresponding input signal transistor ($M_1$, $M_2$), the first and the second node ($N_1$, $N_2$) being located, respectively, between the source-drain path of the input signal transistor ($M_1$, $M_2$) and that of the corresponding load ($M_3$, $M_4$) in the first and second branch, respectively.

6. Semiconductor apparatus according to claim 4 in which the source-drain path of the first intermediate amplifier transistor ($M_8$) is connected in series with that of a second intermediate amplifier transistor ($M_9$).

7. Semiconductor apparatus according to claim 6 in which a fourth node ($N_4$) between the source-drain paths of the first and second intermediate amplifier transistors ($M_8$, $M_9$) is connected to the input terminal of an inverting amplifier ($-A_2$).

8. Semiconductor apparatus according to claim 7 in which an output node ($N_5$) of the said inverting amplifier ($-A_2$) is connected through a buffer amplifier ($A_3$) in series with a compensating capacitor ($C_c$) to the second node ($N_2$).

9. Semiconductor apparatus according to claim 5 in which each said load device is an MOS transistor whose gate electrode is connected to its source.

10. A differential amplifier stage (10) which comprises:

(a) a first input MOS transistor ($M_1$) whose source-drain path is connected in series with that of a third MOS transistor ($M_3$), thereby forming a first node ($N_1$) between their respective source-drain paths;

(b) a second input MOS transistor ($M_2$) whose source-drain path is connected in series with that of a fourth MOS transistor ($M_4$), thereby forming a second node ($N_2$) between their respective source-drain paths;

(c) a current-source MOS transistor ($M_5$) whose source-drain path is connected to a third node ($N_3$) to which the source-drain paths of the first and second transistors ($M_1$, $M_2$) are connected in common;

(d) a feedback loop from said first node ($N_1$) to a feedback node ($N_F$) connected to the gate electrode of the current-source transistor ($M_5$), said feedback loop including a first auxiliary transistor ($M_6$) having one of its controlled terminals connected to the feedback node ($N_F$) and having its gate electrode directly connected to the first node ($N_1$);
- (e) a first intermediate amplifier MOS transistor ($M_8$) whose gate electrode is connected to the feedback node ($N_F$).

11. An amplifier stage according to claim 10 in which said feedback loop includes a bypass capacitor ($C_A$) connected between the first node ($N_1$) and a reference voltage terminal (ground).

12. An amplifier stage according to claim 11 in which said feedback loop further includes a second auxiliary transistor ($M_7$) one of whose controlled terminals and whose gate electrode are connected to the feedback node ($N_F$).

13. An amplifier stage according to claim 11 or 12 in which the source-drain path of the first intermediate amplifier transistor ($M_8$) is connected in series with that of a second intermediate amplifier transistor ($M_9$).

* * * * *